United States Patent [19]

Smith et al.

[11] Patent Number: 4,947,169
[45] Date of Patent: Aug. 7, 1990

[54] DUMMY/TRIM DAC FOR CAPACITOR DIGITAL-TO-ANALOG CONVERTER

[75] Inventors: Lewis R. Smith; David M. Thomas, both of Tucson, Ariz.

[73] Assignee: Burr-Brown Corporation, Tucson, Ariz.

[21] Appl. No.: 426,799

[22] Filed: Oct. 24, 1989

[51] Int. Cl.$^5$ .............................................. H03M 1/06
[52] U.S. Cl. .................................... 341/121; 341/118; 341/120
[58] Field of Search ............... 341/118, 120, 121, 144, 341/150, 155, 172; 307/241

[56] References Cited

U.S. PATENT DOCUMENTS

| | | | |
|---|---|---|---|
| 4,138,671 | 2/1979 | Comer et al. | 341/121 |
| 4,150,366 | 4/1979 | Price | 340/347 |
| 4,222,107 | 9/1980 | Mrozowski et al. | 341/120 X |
| 4,272,760 | 6/1981 | Prazak et al. | 341/120 |
| 4,335,371 | 6/1982 | Connolly, Jr. et al. | 340/347 |
| 4,338,590 | 7/1982 | Connolly, Jr. et al. | 340/347 |
| 4,344,067 | 8/1982 | Lee | 341/120 |
| 4,523,182 | 6/1985 | Harvey et al. | 340/347 |
| 4,568,917 | 2/1986 | McKenzie et al. | 340/347 |
| 4,584,568 | 4/1986 | Zomorrodi | 340/347 |
| 4,616,212 | 10/1986 | Law et al. | 340/347 |
| 4,618,852 | 10/1986 | Kelly et al. | 341/172 X |
| 4,647,906 | 3/1987 | Naylor et al. | 341/144 X |
| 4,851,838 | 7/1989 | Shier | 341/121 |

OTHER PUBLICATIONS

"A Charge-Transfer Multiplying Digital-to-Analog Converter", by José F. Albarrán and David A. Hodges, reprinted from IEEE J. Solid-State Circuits, vol. SC-11, pp. 772-779, Dec. 1976, (pp. 129-136).

Primary Examiner—William M. Shoop, Jr.
Assistant Examiner—Brian K. Young
Attorney, Agent, or Firm—Cahill, Sutton & Thomas

[57] ABSTRACT

In one embodiment, a successive approximation analog-to-digital converter having a main CDAC and a trim CDAC includes resistors in the main CDAC connected in series with various bit switch FETs. The resistors are precisely matched to equivalent resistances of trimmable voltage divider circuits connected in series with various corresponding bit switch FETs in the trim DAC, to prevent non-linear parasitic capacitance and voltage-current properties of first and second clamping FETs from "unbalancing" the voltages on the charge summing conductors of the main DAC and the trim DAC during turn-off of the first and second clamping FETs after they have been turned on to equalize the voltages of the charge summing conductors. In another embodiment, separate trim and dummy DACs are provided to improve the accuracy to which the resistances in the main CDAC and trim CDAC can, as a practical matter, be matched.

20 Claims, 5 Drawing Sheets

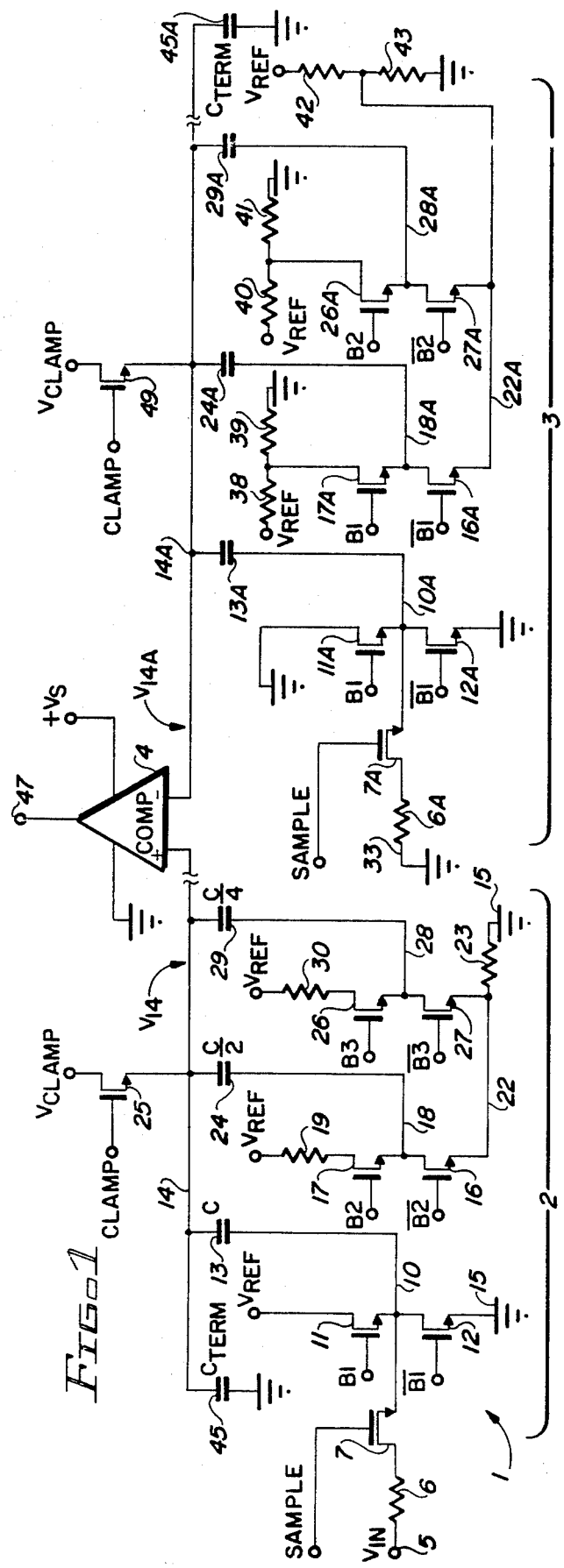
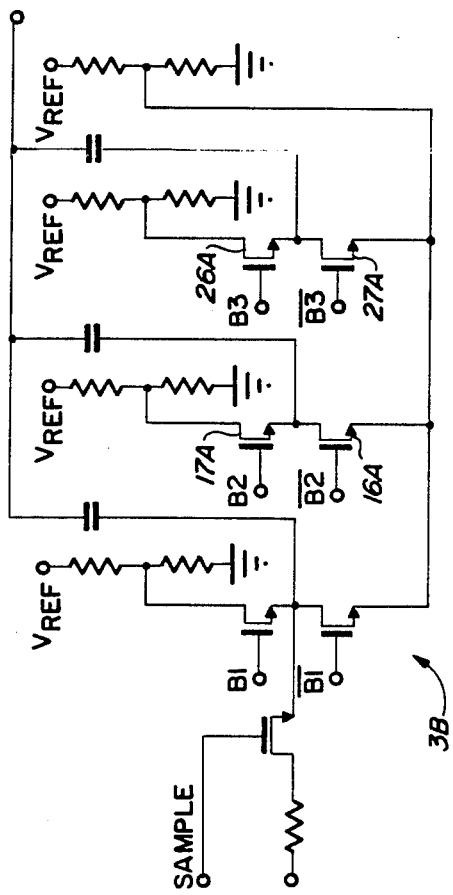
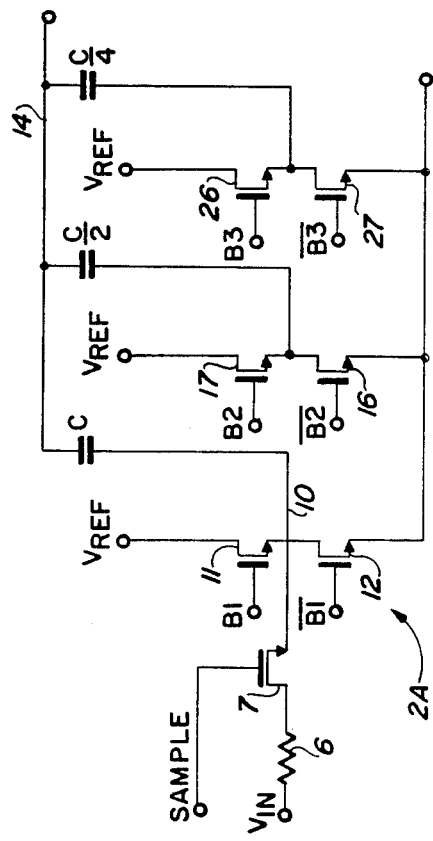
FIG.1
FIG.2A
FIG.2B

1

DUMMY/TRIM DAC FOR CAPACITOR DIGITAL-TO-ANALOG CONVERTER

BACKGROUND OF THE INVENTION

The invention relates to capacitor digital-to-analog converters (CDACs), and particularly to compensation DACs used to compensate for imperfections in manufacture of capacitive components in a CDAC and for compensating various parasitics therein.

CDACs are well known. The state of the art is generally indicated in "A charge-transfer multiplying digital-to-analog converter" by Albarran and Hodges, *IEEE Journal of Solid-State Circuits,* Vol. SC-11, pages 772–779, December 1976, incorporated herein by reference. A CDAC uses a binarily weighted array of capacitors (instead of a binarily weighted R/2R resistive divider array) in conjunction with bit switch circuits that respond to binary input signals to convert a digital input word to a corresponding analog output signal. A typical CDAC includes a "main DAC" portion each bit of which includes a pullup MOSFET (Metal Oxide Semiconductor Field Effect Transistor) selectively connecting the capacitor of that bit to a precise reference voltage. Each bit also includes a pulldown MOSFET selectively connecting one electrode of the same capacitor to ground. The other terminal of each of the capacitors of the respective bits is connected to a first charge summing conductor. One of the main commercial uses of CDACs is in successive approximation analog-to-digital converters (ADCs). Such an analog-to-digital converter includes a "trim CDAC" which includes a second charge summing conductor. Resistors in voltage divider circuits in the trim CDAC typically are laser trimmed during manufacture to compensate for minute errors in the main CDAC (which contains no resistors corresponding to the voltage dividers) due to inaccuracies in manufacture of the binarily weighted capacitors of the main CDAC, and also to compensate for various parasitic capacitances associated with "clamp" MOSFETs utilized to precisely charge the first and second charge summing conductors to another reference voltage prior to the conversion operation of the CDAC. In the above-mentioned successive approximation ADCs, when each pullup or pulldown MOSFET of a bit of the main CDAC is actuated, a corresponding bit of the trim CDAC also is actuated, and a minute amount of charge precisely established by laser trimming of the corresponding voltage divider circuit is introduced into the charge summing conductor of the trim CDAC. FIG. 2 and its associated description of commonly assigned patent application "DUAL ANALOG-TO-DIGITAL CONVERTER WITH SINGLE SUCCESSIVE APPROXIMATION REGISTER", by Naylor et al., Ser. No. 308,150, filed on Feb. 8, 1989, incorporated herein by reference, and associated description are generally indicative of the state of the art for so-called trim DACs in CDACs of successive approximation ADCs.

Compensation DACs have been utilized to balance mismatches/inaccuracies in the binarily weighted capacitors of the main DAC and also to compensate for various other effects that have not been well understood such prior trim DACs also have been used for the purpose of "balancing out" effects of mismatches in charge injected into the two charge summing conductors by turn-off of the two clamping MOSFETs, respectively, so that all such charge injection is "common mode" with respect to the two charge summing conductors and the inputs of the comparator connected thereto. Prior compensation DACs also have been used to balance out the effects of coupling high frequency noise from the power supply through the bit switch pulldown MOSFETs, the input capacitances of the comparator of the successive approximation ADC, and parasitic capacitive coupling between the substrate and charge summing conductors, so that all such parasitic high frequency noise coupling is "common mode" with respect to the two charge summing conductors and the comparator inputs connected thereto.

The closest prior art is believed to be indicated by the circuit shown in FIG. 4, referred to subsequently.

The prior trim CDACs have not succeeded in improving the accuracy and/or yield of successive approximation ADCs as much as would be desirable apparently because the error-producing charge injection mechanisms have not been sufficiently well understood to address the task of compensating such mechanisms, and because the effects of such error-causing charge injection mechanisms on circuit operation have not been sufficiently well understood. There remains an unmet need for a more accurate CDAC, having an improved power supply rejection ratio, and particularly a successive approximation ADC utilizing such a more accurate CDAC.

SUMMARY OF THE INVENTION

It is an object of the invention to provide improved accuracy in a successive approximation analog-to-digital converter of the type using CDACs.

It is another object of the invention to provide improved power supply rejection ratio in a CDAC, and more particularly to improve the power supply rejection ratio of a successive approximation ADC containing such a CDAC.

It is another object of the invention to provide a circuit and method for providing improved offset voltage in an ADC including a CDAC.

It is another object of the invention to provide a circuit and technique for accurately equalizing voltages on charge summing conductors of a CDAC in an ADC prior to the conversion cycle.

Briefly described, and in accordance with one embodiment thereof, the invention provides circuitry and technique for improving the offset voltage of a successive approximation analog-to-digital converter including a first CDAC and a second CDAC, by turning on first and second clamping FETs (each of which exhibits non-linear parasitic capacitances and voltage-current properties) to charge first and second charge summing conductors of the first and second CDACs, respectively, to a reference voltage, turning on a first sampling FET of the first CDAC while the first and second clamping FETs are on to charge a most significant capacitor of the first CDAC to an analog input voltage, turning the first and second clamping FETs off while causing parasitic charge injection currents produced by the non-linear parasitic capacitances of the first and second clamping FETs to flow through a plurality of capacitors, resistors connected in series with various bit switches, and parasitic bit switch capacitances in the first and second CDACs, respectively, and then turning the first sampling FET off. The corresponding bit switch circuits and binarily weighted capacitors of the first and second CDACs are precisely matched. The series-connected resistors of the first CDAC are precisely matched to equivalent resistances of resistive voltage divider circuits connected in series with corresponding bit switch circuits of the second CDAC. The inclusion of the series-connected resistors in the first CDAC and the matching thereof with the corresponding equivalent resistances in the second CDAC causes voltages on the first and second charge summing conductors to be precisely equal at the end of the turnoff transition time of the first and second clamping FETs despite the non-linear parasitic capacitances and voltage-current properties of the first and second clamping FETs.

In another embodiment, a successive approximation analog-to-digital converter includes a main CDAC and separate "trim" and "dummy" CDACs. The main CDAC includes a first charge summing conductor and a first clamping MOSFET coupled between a clamp voltage and the first charge summing conductor. A first group of binarily weighted capacitors is coupled to the first charge summing conductor. A first group of bit switch circuits is coupled to the capacitors, respectively. The bit switch circuits electrically couple the capacitors, respectively, to either of two voltage levels during a conversion cycle of the analog-to-digital converter. A sampling switch couples an analog input voltage through a source resistance to a most significant binarily weighted capacitor during a sample cycle. The dummy DAC includes a second charge summing conductor and a second clamping MOSFET coupled between the clamp voltage and the second charge summing conductor. A second group of binarily weighted capacitors is coupled to the second charge summing conductor. A second group of bit switch circuits of the dummy DAC is coupled to the capacitors, respectively. The bit switch circuits of the second group electrically couple the capacitors of the second group, respectively, to a ground voltage. The dummy CDAC includes a sampling switch coupling the ground voltage through a matched source resistor to a most significant capacitor of the second group during the sample cycle. The trim DAC includes a third group of binarily weighted capacitors, and, in the described embodiment, a stepdown capacitor for coupling the third group of binarily weighted capacitors to the second charge summing conductor. A third group of bit switch circuits is coupled to the capacitors of the third group, and a group of resistive voltage dividers is coupled to the bit switches of the third group to electrically couple the capacitors of the third group in series with the resistive voltage dividers, respectively, during the conversion cycle. The trim DAC includes a sampling switch coupling a trim source resistor in series with a most significant capacitor of the third group during the sample cycle. Each of the capacitors of the first group is essentially identical to a corresponding capacitor of the second group, the resistance of each resistor of each bit switch circuit of the first group being equal to the equivalent resistance of a voltage divider in the dummy CDAC. The foregoing configuration results in voltages on the first and second charge summing conductors being precisely equal after turning the first and second clamping MOSFETs off, despite non-linear gate capacitances and non-linear voltage-current properties of the first and second clamping MOSFETs.

BRIEF DESCRIPTION OF THE DRAWINGS

FIG. 1 is a schematic diagram of a presently preferred embodiment of the invention.

FIG. 2A is a schematic diagram of block 2B of FIG. 2.

FIG. 2B is a schematic diagram of block 3B of FIG. 2.

DETAILED DESCRIPTION OF THE PREFERRED EMBODIMENTS

Figure 2:
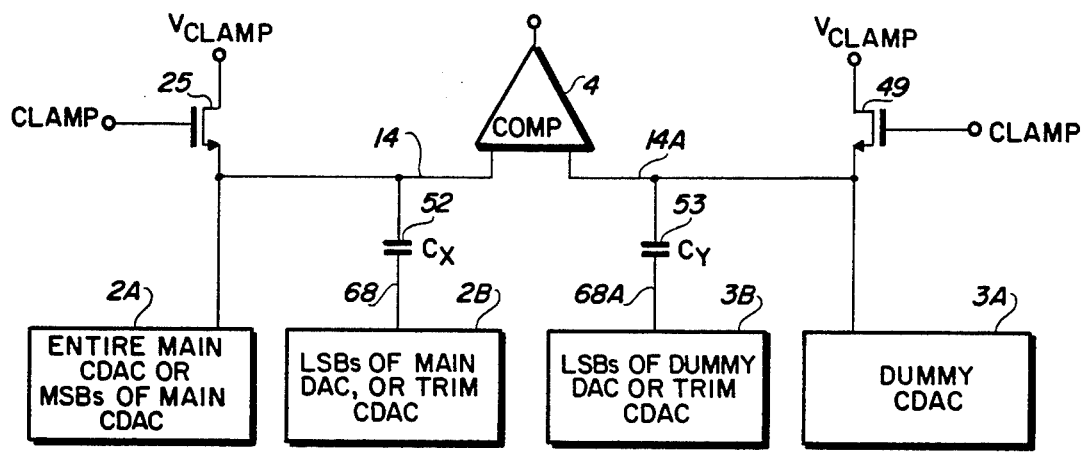
FIG. 2 is a block diagram of an alternate embodiment of the invention which in the future may be the best mode of practicing the invention.

In FIG. 1, a first embodiment of the invention includes a CDAC 1 in a successive approximation ADC. CDAC 1 includes a main CDAC 2 (hereinafter referred to simply as "main DAC 2"), a "compensation" CDAC 3 (hereinafter referred to simply as "compensation DAC 3") that incorporates a plurality of binarily weighted capacitors (one for each bit), coupled to a plurality of bit switch circuits, which are coupled to a plurality of nichrome resistors. The ADC includes a comparator 4 having a non-inverting input connected to a first charge summing conductor 14 of main DAC 2 and an inverting input connected to a second charge summing conductor 14A. The output of comparator 47 is connected to control circuitry (not shown) that produces digital input bits B1, B2, B3, etc. to determine whether each successive approximation represented as a configuration of the digital input bits B1, B2, B3, etc. applied to the various bit switch circuits is to be "accepted" or "rejected" (as is well known to those skilled in the art).

Main DAC 2 includes an input conductor 5 on which an analog input voltage $V_{IN}$ that varies between $-V_{REF}$ and $+V_{REF}$ is applied. An input resistor or source resistance 6 is connected between conductor 5 and the drain of an N-channel MOSFET 7. The source of MOSFET 7 is connected by conductor 10 to the source of N-channel pullup MOSFET 11, the drain of N-channel pulldown MOSFET 12, and to one terminal of the MSB (most significant bit) capacitor 13. Pullup MOSFET 11 and pulldown MOSFET 12 form the bit switch circuit for the most significant bit of main CDAC 2. The other terminal of capacitor 13 is connected to charge summing conductor 14.

The gate of sampling MOSFET 7 is connected to a SAMPLE signal conductor which applies a logical "one" to the gate of MOSFET 7 during the "sample" cycle and a "zero" thereto during the "conversion" cycle of the successive approximation ADC. The drain of pullup MOSFET 11 is connected to a circuit which produces a reference voltage $V_{REF}$ of approximately 2 volts. One of a variety of reference voltage circuits that might be used is shown in commonly assigned co-pending application Ser. No. 308,109, filed Feb. 8, 1989, entitled "CMOS VOLTAGE REFERENCE AND BUFFER CIRCUIT" by T. Kalthoff, and incorporated herein by reference. The gate of pullup MOSFET 11 is connected to receive a digital bit signal B1 generated by the above-mentioned control circuit. The gate of pulldown MOSFET 12 is connected to receive a $\overline{B1}$ signal, which is the logical complement of B1. The source of pulldown MOSFET 12 is connected to ground conductor 15.

Similarly, the second most significant bit of main DAC 2 includes pullup MOSFET 17 and pulldown MOSFET 16 having their source and drain, respectively, coupled by conductor 18 to one terminal of the second most significant bit capacitor 24, the other terminal of which is connected to charge summing conductor 14. The gates of MOSFETs 17 and 16 are connected to receive the bit switch signals B2 and $\overline{B2}$, respectively. The drain of MOSFET 17 is connected by a resistor 19 to $V_{REF}$. The source of pulldown MOSFET 16 is connected by conductor 22 to one terminal of resistor 23, the other terminal of which is connected to ground conductor 15. The third most significant bit includes pullup MOSFET 26 and pulldown MOSFET 27 which have their gate electrodes connected to receive bit switch signals B3 and $\overline{B3}$, respectively. The source of MOSFET 27 is connected to conductor 22 and its drain is connected by conductor 28 to the source of pullup MOSFET 26. The drain of MOSFET 26 is connected by resistor 30 to $V_{REF}$. This pattern is repeated for as many additional successively less significant bits as is desired. If desired, the conventional technique of using stepdown capacitors to isolate or "segment" suitable groups of bits is used.

Charge summing conductor 14 is connected to the source of a clamping transistor 25, the drain of which is connected to a DC voltage $V_{CLAMP}$, which can be generated by any of a number of simple circuits, and can have a value of 2 volts. The gate of MOSFET 25 is connected to receive the signal CLAMP during the sample cycle.

Compensation DAC 3 includes a desired number of bits which in essence are very accurate duplicates of a group of successive most significant bits of main DAC 2. Conductor 33 is connected to ground and resistor 6A, which is identical to source resistor 6. Resistor 6A also is connected to the drain of MOSFET 7A, the gate of which is connected to receive the signal SAMPLE. (Note that the same or similar reference numerals have been generally utilized to indicate corresponding components in FIGS. 1–3. For example, where components in compensation DAC 3 correspond to those in main DAC 2, the same reference numeral, followed by an "A", is used to refer to the component in the compensation DAC.) The source of MOSFET 7A is connected by conductor 10A to the source of pullup MOSFET 11A, the drain of pulldown MOSFET 12A, and one terminal of capacitor 13A. The channel resistances of pullup MOSFETs 11 and 11A are essentially identical. The channel resistances of pulldown MOSFETs 12 and 12A are essentially identical. The other terminal of capacitor 13A is connected by conductor 14A to the upper terminals of capacitors 24A and 29A and to the source of MOSFET 49.

The gates of pullup MOSFET IIA and pulldown MOSFET 12A are connected to receive the Bl and $\overline{Bl}$ signals, respectively. The drain of pullup MOSFET IIA is connected to ground. The source of pulldown MOSFET 12A is connected to ground. The channel resistances of MOSFETs 7 and 7A are essentially identical. Thus, the most significant bit circuit configuration of trim DAC 3 is essentially identical to the most significant bit circuit configuration of main DAC 2.

The second most significant bit of compensation DAC 3 includes pullup MOSFET 17A and pulldown MOSFET 16A which are identical in size and geometry to pullup MOSFET 17 and pulldown MOSFET 16 of main DAC 2, respectively. The gates of MOSFETs 17A and 16A are connected to receive bit switch signals B1 and $\overline{B1}$, respectively. The drain of pullup MOSFET 17A is connected to the junction between resistors 38 and 39 which form a voltage divider connected between $V_{REF}$ and ground. Conductor 18A is connected to the source of pullup transistor 17A, the drain of pulldown transistor 16A, and to the lower terminal of CDAC capacitor 14A, the upper terminal of which is connected to charge summing conductor 14A.

Similarly, the third most significant bit of compensation DAC 3 includes pullup MOSFET 26A and pulldown MOSFET 27A having their gates connected to receive bit switch signals B2 and $\overline{B2}$, respectively. MOSFETs 26A and 27A have channel resistances matched to those of MOSFETs 26 and 27, respectively. The source of MOSFET 26A and the drain of MOSFET 27A are connected by conductor 28A to the lower terminal of CDAC capacitor 29A, the upper terminal of which is connected to charge summing conductor 14A. The drain of MOSFET 26A is connected to the junction between voltage divider resistors 40 and 41, which are connected in series between VRB and ground. The sources of the pulldown MOSFETs 16A and 27A are connected by conductor 22A to the junction between voltage divider resistors 42 and 43, which are connected between $V_{REF}$ and ground.

Charge summing conductor 14A is connected to the source of clamp MOSFET 49, the gate of which is connected to receive the signal CLAMP, and the drain of which is connected to $V_{CLAMP}$.

The resistive voltage dividers connected to the drains of the pullup MOSFETs in a compensation or trim DAC and to the sources of the pulldown MOSFETs therein is known to provide a large voltage division ratio that allows minute, laser trimmable amounts of charge to be injected via the corresponding binarily weighted capacitors into charge summing conductor 14A to compensate for mismatches in the ratios between the binarily weighted capacitors in main DAC 2.

In the embodiment of the invention represented by FIG. 1, compensation DAC 3 actually includes 6 bit switch circuits that are similar, except for the voltage divider circuits connected to the drains of the pullup MOSFETs, to the most significant 6 bit switch circuits of main DAC 2, respectively. The CDAC capacitors 13, 24, 29, etc. are binarily weighted to have values of C, C/2, C/4 ..., where C is approximately 20 picofarads. Capacitors 13A, 14A, 29A, etc. are identical to capacitors 13, 14, 29, etc., respectively. The resistance of nichrome resistor 19 is equal to the parallel equivalent resistance of nichrome resistors 38 and 39. (Other thin film resistor materials such as sichrome or tantalum nitride can be used, of course, instead of nichrome.) The resistance of resistor 30 is set equal to the parallel equivalent resistance of resistors 40 and 41. The resistance of resistor 23 is set equal to the resistance of parallel resistors 42 and 43 and so forth for additional successively less significant bits. A typical value of resistors 19 and 30 is 0.96 kilohm. Resistor 23 might be 0.96 kilohm. Resistors 6 and 6A might be 1 kilohm. Resistors 38 and 39 might be 25 and 1 kilohms, respectively.

A termination capacitor 45 having a capacitance $C_{TERM}$ equal to the capacitance of the least significant capacitor of main DAC 2 is connected between charge summing capacitor 14 and ground. An identical termination capacitor 45A is connected between charge summing conductor 14A and ground.

Figure 4:
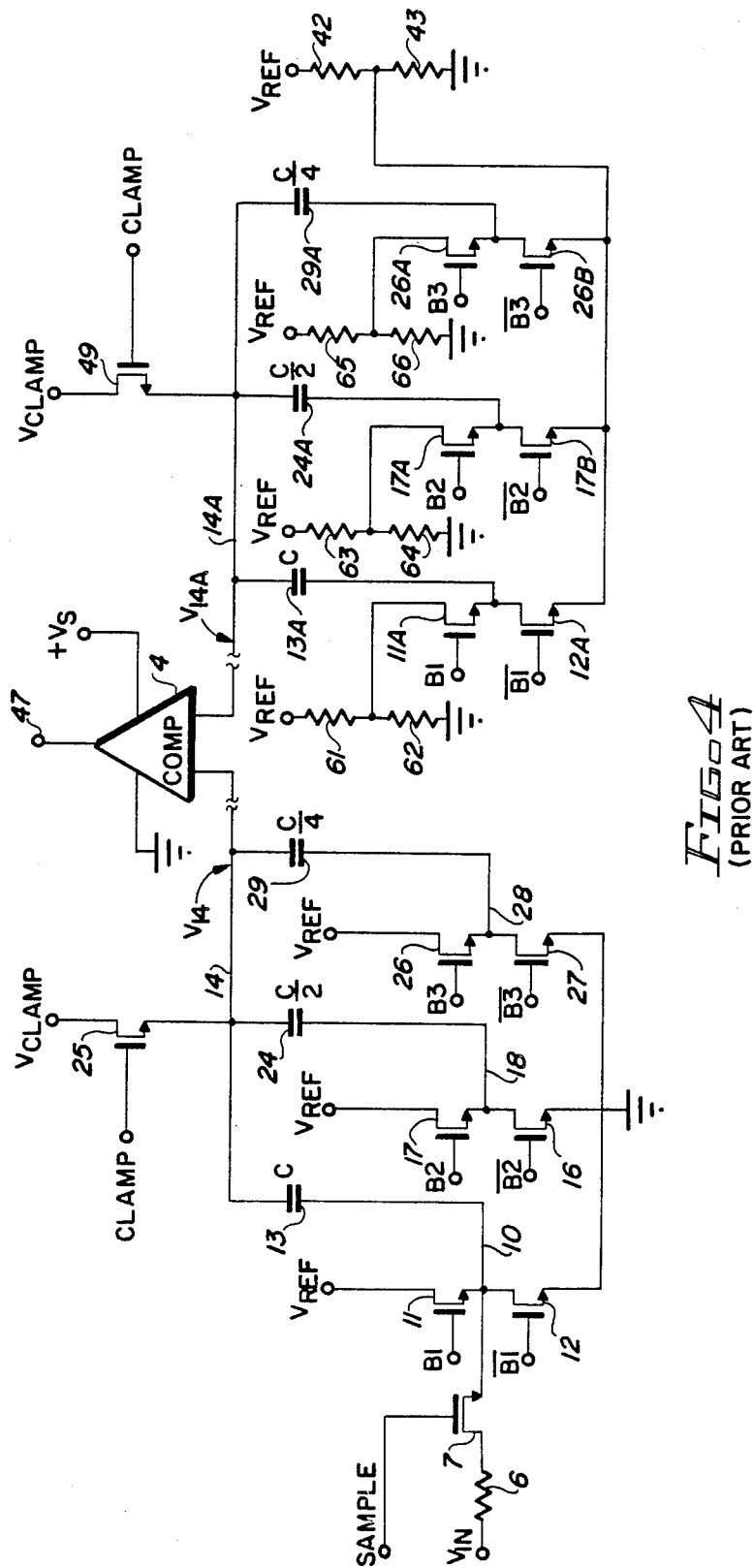
FIG. 4 is a schematic diagram of the closest prior art.

The basic operation of the CDACs in the successive approximation analog-to-digital converters of FIGS. 1 and 4 is well known and therefore will not be set forth.

In accordance with the present invention, it has been found that circuitry which drives the gates of the bit switch pullup MOSFETs and pulldown MOSFETs frequently causes undesirable changes in the charge summing conductor voltages by coupling high frequency power supply noise into the two charge summing conductors 14 and 14A via the gate capacitances of the bit switch pullup and pulldown MOSFETs. High frequency noise "glitches" that occur on the power supply $V_S$ conductor during the conversion cycle may result in incorrect "bit decisions" by comparator 4 if such noise glitohes are not forced to be "common mode" with respect to both inputs of comparator 4 by precise balancing of the type described herein.

More importantly, and in accordance with the present invention, it has been found that errors are produced in the voltages on charge summing conductors 14 and 14A during the end portion of the sample cycle, and that such errors are much more dependent on the preciseness of matching of the trim resistors such as 17, 26, and 23 of main DAC 2 and corresponding trim resistors such as 17A, 26A, and 23A of the compensation DAC 3 than would have been expected. The reasons for this result are not well understood.

However, it is known that the turn-off of a MOSFET driving a high capacitance conductor is very complex. We thought that if clamp MOSFETs 25 and 49 are precisely matched and the corresponding main DAC and compensating DAC capacitors such as 13 and 13A are precisely matched, the turn-off of clamp MOSFETs 25 and 49 by the signal CLAMP with, for example, a five volt turn-off transition time of five nanoseconds, would result in adequate equalizing of the voltages on charge summing conductors 14 and 14A. We did not recognize that mismatches in resistances connected in series with the binarily weighted capacitors 13, 24, etc. and 13A, 24A, etc. would significantly affect the preciseness of the match of such voltages on charge summing conductors 14 and 14A.

In other words, we expected that in the prior art circuit of FIG. 4, if clamp MOSFETs 25 and 49 are matched and capacitors 13, 24, 29, etc. are matched to capacitors 13A, 24A, 29A, etc., respectively, then when clamp MOSFETs 25 and 49 are completely turned off before the beginning of the conversion cycle, charge summing conductors 14 and 14A would be at adequately equal voltages.

In accordance with the present invention, it was found necessary to insert resistors such as 19 and 30 in main DAC 2 of FIG. 1 (but not present in the prior art DAC of FIG. 4) in series with the drain of all of the pullup MOSFETs such as 17 and 26 to match the equivalent resistance of the trim resistor voltage dividers such as 38,39 and 40,41 in compensation DAC 3 of FIG. 4. Similarly, it was found necessary to insert resistors such as 23 in FIG. 1 (but not present in the prior art circuit of FIG. 4) in series with the sources of the pulldown MOSFETs such as 16 and 27 in main DAC 2 of FIG. 1 to match the equivalent parallel resistance of voltage divider 42,43 in compensation DAC 3.

Figure 3:
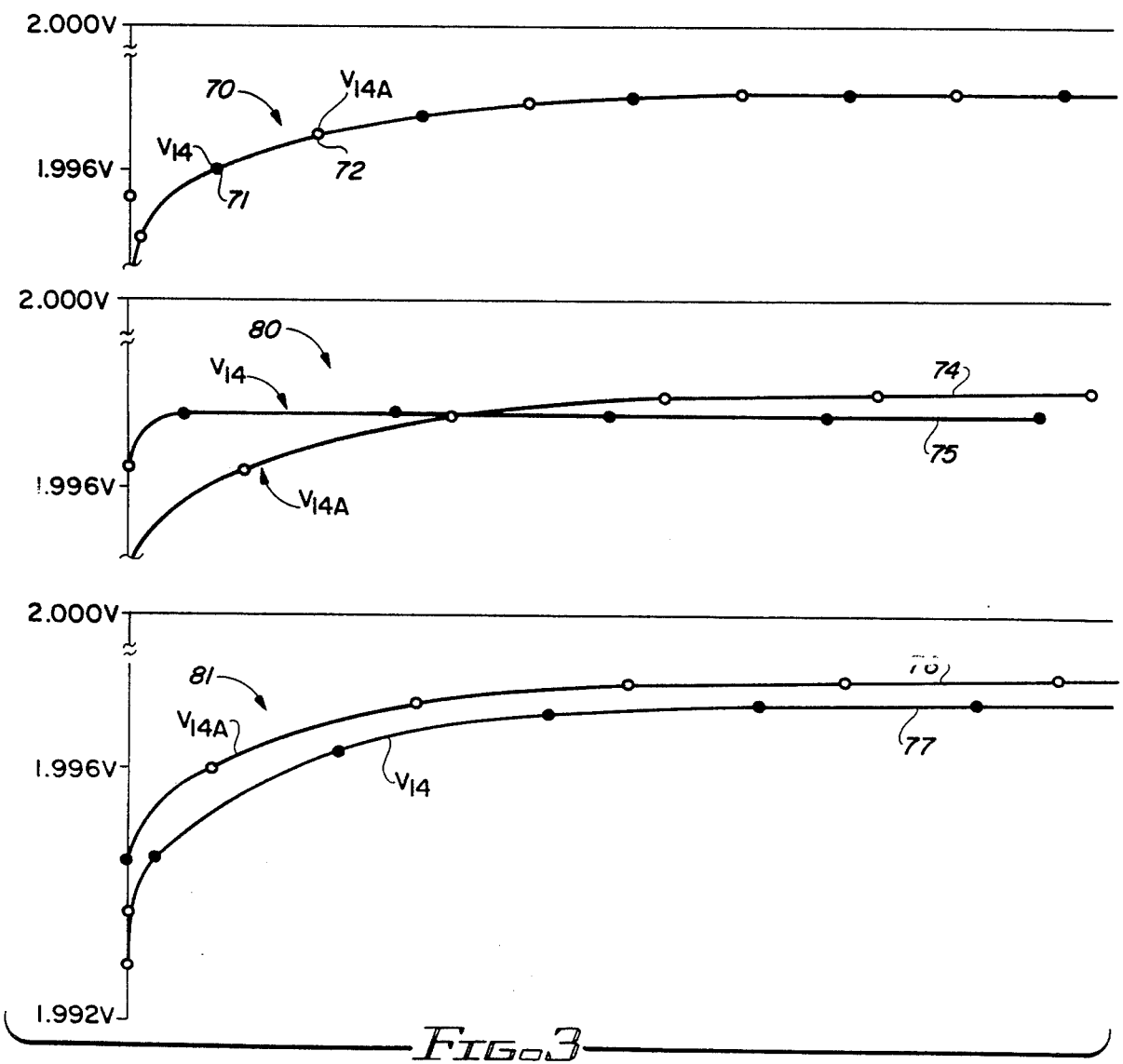
FIGS. 3A–3C are diagrams including waveforms of voltages on charge summing conductors.

In FIG. 3, curve 70 designates two closely matched curves of $V_{14}$ and $V_{14A}$ that were generated by the well known circuit simulation program PSPICE for the circuit shown in FIG. 1 with capacitors 13, 24, 29, and 45 set equal to 20, 10, 5, and 2.5 picofarads, respectively; capacitors 13A, 24A, 29A, and 45A have the same values, respectively. In this case the resistors in series with each of the capacitors of main DAC 2 are precisely matched to the resistances of the voltage divider circuits connected in series with the corresponding capacitors of compensation DAC 3; clamp MOSFETs clearly leave $V_{14}$ and $V_{14A}$ charged to precisely the same voltage.

However, if the resistance in series with capacitor 13 is set substantially equal to zero and the resistance in series with capacitor 13A is set substantially higher, eg, 15 kilohms, then the waveforms 80 of FIG. 3 indicate that $V_{14}$ is charged rapidly to a voltage level 75, and $V_{14A}$ is charged more slowly to a substantially higher voltage level 74.

If the resistance in series with capacitor 24 of FIG. 1 (i.e., resistor 19) is set to one kilohm, and the resistance in series with capacitor 24A is set to one ohm, then curves 81 of FIG. 3 indicate that $V_{14}$ is charged to level 77 and $V_{14A}$ is charged to substantially higher voltage level 76.

While these results are not well understood, the circuit performance of an integrated circuit implementation of the invention indicates that the results shown in FIG. 3 are quite accurate, even though it is known that the mathematical model of MOSFETs used in PSPICE does not model the various parasitic capacitances of a MOSFET as accurately as would be desirable.

Thus, the CDAC of FIG. 1 differs from the prior art CDAC of FIG. 4 in several important respects. First, in the prior art CDAC of FIG. 4, the resistors such as 19, 30, and 22 are not present, nor are any resistors in main DAC 2 matched to any resistors in compensation DAC 3. Furthermore, source resistor 6A is not present in compensation DAC 3 of the prior art circuit of FIG. 4. In accordance with the present invention, it has been found that these features are necessary in the embodiment of FIG. 1 to achieve what is deemed to be acceptable power supply rejection ratio of a 12 bit successive approximation ADC and acceptable absolute offset voltage thereof. More specifically, implementation of the circuit arrangement generally shown in FIG. 1 resulted in an offset voltage power supply rejection improvement from at least one significant bit to one-fourth of a significant bit for a normal power supply variation, e.g. 5 percent. The absolute offset voltage also was significantly improved. The power supply rejection ratio also was significantly improved.

The CDAC of FIG. 1 also differs from the particular CDAC IA of FIG. 3 in that for the second most significant bit switch circuit of compensation DAC 3 of FIG. 1, the gate of pullup MOSFET 17A receives the signal Bl, rather than B2, and the gate electrode of pulldown MOSFET 16A receives $\overline{B1}$, rather than $\overline{B2}$. In the third most significant bit of FIG. 1, the signal B2, rather than B3, is applied to the gate electrode of pullup MOSFET 26A. Similarly, $\overline{B2}$, rather than $\overline{B3}$, is applied to the gate electrode of the pulldown MOSFET 27A in FIG. 1. It should be noted that when the above shifting technique is used as in FIG. 1, no voltage divider trim resistors are required for the most significant bit of the compensation DAC 3. Therefore, no trim resistors are needed in series with either the pullup transistor or the pulldown transistor in the most significant bit of main DAC 2. This technique is known in the prior art.

This known technique of "shifting" the digital bit switch signals B1, $\overline{B1}$, B2, $\overline{B2}$, etc. to lower significant bits of the compensation DAC 3 to compensate or balance out errors in higher significant bits of main DAC 2 provides two significant advantages. One advantage is that this technique makes precise matching of the corresponding trim resistors in the main DAC 2 and the compensation DAC 3 less critical. Another reason is that this shifting technique that "frees up" the most significant bit or bits of the compensation DAC 3 for other uses, one of which could be to provide a "bipolar offset" which establishes a "mid-sclae" value of the analog output signal produced, allowing a larger analog input voltage range and improved signal-to-noise ratio.

The embodiment of FIG. 1 has been implemented and tested, and is expected to be used in two of the assignee's products. However, in the future, it is thought that the embodiment shown in FIG. 2 may be the best mode of practicing the invention.

In FIG. 2, a main DAC 2A, having generally the configuration shown in FIG. 2A, is connected to charge summing conductor 14. A stepdown capacitor 52 having a capacitance $C_x$ is connected between charge summing conductor 14 and a charge summing conductor 68. ($C_x$ may have a value equal to that of the smallest binarily weighted capacitor, referred to as a "unit capacitor", used in the CDAC; all larger binarily weighted capacitors then are formed of parallel-connected unit capacitors.) Block 2B may contain a trim CDAC having the configuration shown in FIG. 2B. Alternately, block 2A may include, for example, the six most significant bits of the main DAC 2A. Block 2B could contain circuitry identical to that in block 2A, with the source resistor and the sample MOSFET omitted. Block 2 then would represent the six least significant bits (LSBs) of the main DAC. (In this case, the entire "main CDAC" would include the MSBs in block 2A, charge summing conductor 14, stepdown capacitor 52, charge summing conductor 68, and the LSBs in block 2B.)

Charge summing conductor 14A is connected to a "dummy" CDAC 3A, which is substantially identical to main CDAC 2A, except that its input terminal is connected to ground or other suitable, stable, low impedance, low noise reference voltage source such as $V_{REF}$, and the drains of each of the pullup MOSFETs are connected to a corresponding resistive voltage divider, the resistors of which are connected in series between $V_{REF}$ and ground. A trim CDAC in block 3B has a charge summing conductor 69 connected by means of a stepdown capacitor 53 having a capacitance $C_y$ equal to $C_x$. Three bits of the trim CDAC in block 3B are shown in FIG. 2B. The CDAC contained in block 3B can contain a group of LSBs of a dummy DAC, the MSBs of which are substantially identical to the MSBs in block 3A. If small stepdown capacitor values $C_x$ and $C_y$ are used, the voltage dividers shown in FIG. 2B are so isolated from the charge summing conductor 14A that the absence of resistors in the main DAC circuit of FIG. 2A does not result enough charge injection imbalances to be problematic. The "LSB DACs" and trim DACs indicated in FIG. 2 can be connected to charge summing conductors 14 or 14A without stepdown capacitors, if desired, but then trim resistor matches, as described above, would be required.

The function of the dummy CDAC 3A is to present precisely the same parasitic capacitances to charge summing conductor 14A as are presented to charge summing conductor 14 by the main CDAC in block 2A. This helps to ensure that the objective of providing precisely equal voltages on charge summing conductors 14 and 14A at the end of the turn-off of clamp MOSFETs 25 and 49 is achieved. The function of the separate trim CDAC, regardless of whether it is connected directly to charge summing conductor 14 or charge summing conductor 14A, and also regardless of whether it is coupled indirectly to charge summing conductor 14 or 14A by means of a stepdown capacitor, is to adjust the minute amounts of charge injected into the charge summing conductor 14 or 14A to which the trim DAC is coupled to compensate for any mismatches in the ratios of the various binarily weighted capacitors in main DAC 2 to each other. Such adjustment is accomplished by laser trimming of at least one of the voltage divider trim resistors of various bits of the trim DAC.

The embodiment of the invention shown in FIGS. 2, 2A, and 2B distinguishes further over the prior art shown in FIG. 4 than the embodiment of FIG. 1 by providing separate "dummy" and "trim" CDACs 3A and 3B. Dummy CDAC 3A consists of a preselected number, i.e., 6, of the most significant bits of the main CDAC 2A. The bits of the dummy CDAC 3A preferably are sufficiently precise replicas of the most significant bits of main CDAC 2A that the switching parasitic capacitances of the gates and sources of clamp transistors 25 and 49 will be equalized in such a manner that the effects of these capacitances and other capacitances associated with the input terminals of comparator 4, and other parasitic effects which are not well understood (and are difficult to precisely mathematically model) all will be compensated for.

It should be noted that if a sufficiently high degree of "segmentation" achieved by the above conventional technique of stepdown capacitors is used to couple the trim DAC to charge summing conductor 14A (or 14), the channel resistance and parasitic capacitances of the trim DAC will be insignificant and can be ignored. However, if the parasitic capacitance effects of the trim DAC are significant, either because the trim DAC is connected directly to one of the charge summing conductors 14 or 14A or because the segmentation ratio is too small, a "dummy-trim DAC" essentially identical to the trim DAC needs to be coupled in the same manner (i.e., directly or by means of an identical stepdown capacitor) to the opposite charge summing conductor. A further improvement in accuracy over the embodiment of FIG. 1 then is achieved.

While the invention has been described with reference to several particular embodiments thereof, those skilled in the art will be able to make the various modifications to the described embodiments of the invention without departing from the true spirit and scope of the invention.

What is claimed is:

1. A method of improving the offset voltage of an analog-to-digital converter including a first CDAC and a second CDAC, the method comprising the steps of:
    (a) turning on first and second FETs to charge a first charge summing conductor in the first CDAC to a first reference voltage and to charge a second charge summing conductor in the second CDAC to the first reference voltage, respectively;
    (b) turning on a first sampling FET in the first CDAC, while the first and second FETs are on and charging a most significant capacitor in the first CDAC through the first sampling FET to an analog input voltage;
    (c) turning the first and second FETs off by means of a control signal with a turn-off transition time, the first and second FETs each exhibiting substantially nonlinear parasitic capacitances and substantially nonlinear voltagecurrent properties;

(d) during step (c)

i. causing parasitic currents produced by the turning off of the first FET as a result of the nonlinear parasitic capacitances and the nonlinear voltage-current properties thereof to flow through a plurality of capacitors in the first CDAC and through a plurality of parasitic capacitances of a plurality of bit switch circuits in the first CDAC and through a plurality of resistors connected in series with the bit switches of the first CDAC, respectively, ii. simultaneously with (i), causing parasitic currents produced by turning off of the second FET as a result of the nonlinear parasitic capacitances and the nonlinear voltage-current properties thereof to flow through a plurality of capacitors in the second CDAC and through a plurality of parasitic capacitances of a plurality of bit switch circuits in the second CDAC and through equivalent resistances of a plurality of resistive voltage dividers connected in series with the bit switches, respectively, of the second CDAC, corresponding channel resistances of the corresponding bit switch circuits of the first and second CDACs being matched, the binarily weighted capacitors of the first and second CDACs being matched, and the resistors of the first CDAC being matched to the equivalent resistances of resistive voltage divider circuits, respectively, to thereby cause the voltages on the first and second charge summing conductors to be substantially equal at the end of the turn-off transition time of the control signal despite the nonlinear parasitic capacitances and nonlinear voltage-current properties of the first and second FETs; and (e) turning the first sampling FET off.

2. The method of claim 1 wherein the first and second FETs and the first and second sampling FETs are MOSFETs, the method including applying a most significant bit digital signal and a logical complement signal thereof to a most significant bit switch circuit of the first CDAC and to both a most significant bit switch of the second CDAC and a less significant bit switch circuit of the second CDAC;

applying a second most significant bit digital signal and a logical complement signal thereof to a second most significant bit switch circuit of the first CDAC and to a less significant bit switch circuit of the second CDAC.

3. The method of claim 1 including causing corresponding parasitic currents produced in response to the high frequency noise on each of the most significant bit digital signal, the second most significant bit digital signal, and the logical complement signals and flowing in the parasitic capacitance of the bit switch circuits of the first and second CDACs, respectively, to be equal, to thereby cause parasitic voltage changes produced on the first and second charge summing conductors by such corresponding parasitic currents to be equal.

4. The method of claim 1 wherein the capacitors of the first CDAC are binarily weighted, respectively, the method including laser trimming various voltage divider circuits to cause the bit switch circuits of the second CDAC to inject enough charge into or out of the second charge summing conductor to compensate for ratio mismatches between various capacitors of the first CDAC.

5. The method of claim 1 wherein the first sampling FET is a first sampling MOSFET and step (b) includes charging a most significant capacitor of the first CDAC through the first sampling MOSFET and a source resistance to an analog input voltage.

6. The method of claim 5 wherein step (b) includes turning on a second sampling MOSFET in the second CDAC while the first and second FETs are on and charging a most significant capacitor of the second CDAC through the second sampling MOSFET and a dummy source resistor to a ground voltage, the dummy source resistor being matched to the source resistance.

7. The method of claim 6 wherein step (c) includes turning the first and second MOSFETs off with the turn-off transition time being equal to approximately 5 nanoseconds.

8. In a successive approximation analog-to-digital converter, CDAC circuitry comprising in combination:

(a) a first CDAC including i. a first charge summing conductor, ii. a first group of binarily weighted capacitors each having a first terminal coupled to the first charge summing conductor, iii. a first group of bit switch circuits each including an output coupled to a second terminal of a corresponding capacitor of the first group, each bit switch circuit including a pullup FET having a gate coupled to receive a corresponding digital input bit signal, a drain coupled by a first resistor to a first reference voltage, and a source coupled to the output of that bit switch circuit, each bit switch circuit including a pulldown FET having a gate coupled to receive a complement of the digital input bit signal, a source coupled by a second resistor to a second reference voltage, and a drain coupled to the output of that bit switch circuit;

(b) a second CDAC including i. a second charge summing conductor, ii. a second group of binarily weighted capacitors each having a first terminal coupled to the second charge summing conductor, iii. a second group of bit switch circuits each including an output coupled to a second terminal of a corresponding capacitor of the second group, each bit switch circuit of the second group including a pullup FET having a gate coupled to receive a corresponding digital input bit signal, a source coupled to the output of that bit switch circuit, each bit switch of the second group including a pulldown FET having a gate coupled to receive a complement of the digital input bit signal, a source coupled by a first resistor to the second reference voltage, and a drain coupled to the output of that bit switch circuit, each bit switch circuit of the second group including a trimmable resistive voltage divider circuit including a second resistor coupled between the first reference voltage and a drain of the pullup FET of that bit switch circuit and a third resistor coupled between the drain of the pullup FET of that bit switch circuit and the second reference voltage conductor, each of the capacitors of the first group being matched to a corresponding capacitor of the second group, the resistance of the first resistor of each bit switch circuit of the first group being equal to the equivalent resistance of the second and third resistors of the voltage divider of a corresponding bit switch circuit of the second group.

9. In a successive approximation analog-to-digital converter, the CDAC of claim 8 wherein each of the first and second resistors of the first CDAC and each of the first, second, and third resistors of the second CDAC is composed of thin film, and wherein each of the pullup and pulldown FETs of the first CDAC is a MOSFET, and each of the pullup and pulldown FETs of the second CDAC is a MOSFET, the CDAC circuitry including a first clamping MOSFET coupled between a third reference voltage and the first charge summing conductor, and a second clamping MOSFET coupled between the third reference voltage and the second charge summing conductor.

10. In a successive approximation analog-to-digital converter, the CDAC of claim 9 wherein at least one of the second and third resistors of each bit switch circuit of the second group is adjusted to cause an RC time constant associated with a capacitor of that bit switch circuit to precisely equal an RC time constant of a capacitor and first resistor of a corresponding bit switch circuit of the first group.

11. In a successive approximation analog-to-digital converter, the CDAC circuitry of claim 9 wherein the first CDAC further includes a most significant capacitor and a most significant bit switch circuit with a pullup MOSFET connected directly to the first reference voltage and a pulldown MOSFET coupled directly to the second reference voltage and an output connected to the most significant capacitor, and wherein the second CDAC further includes a most significant capacitor, a most significant bit switch circuit including a pullup MOSFET connected directly to a fixed reference voltage, a pulldown MOSFET connected directly to the fixed reference voltage, and an output connected to the most significant capacitor thereof, the CDAC circuitry including a first sampling MOSFET in the first CDAC coupled between an analog input terminal and the most significant capacitor of the first CDAC, a source resistance coupled in series with the first sampling MOSFET, and a second sampling MOSFET in the second CDAC coupled between a first reference voltage and a most significant capacitor of the second CDAC.

12. In a successive approximation analog-to-digital converter, the CDAC of claim 11 including a dummy source resistor coupled in series with the second sampling MOSFET, the source resistor being matched to the dummy source resistor, the first and second sampling MOSFETs being matched.

13. In a successive approximation analog-to-digital converter, the CDAC of claim 8 wherein the first CDAC includes 12 bits, each including one of the capacitors and one of the bit switch circuits of the first CDAC, and the second CDAC includes 6 bits, each including one of the capacitors and one of the bit switch circuits of the second CDAC.

14. In a successive approximation analog-to-digital converter, the CDAC circuitry of claim 13 wherein the most significant capacitor of the first CDAC is matched to the most significant capacitor of the second CDAC.

15. In a successive approximation analog-to-digital converter, CDAC circuitry comprising in combination:
(a) a main CDAC including a first charge summing conductor, and a first clamping FET coupled between a clamp voltage and the first charge summing conductor,
a first group of binarily weighted capacitors coupled to the first charge summing conductor,
a first group of bit switch circuits coupled to the capacitors, respectively,
a first group of resistors coupled to the bit switch circuits, respectively,
the bit switch circuits electrically coupling the capacitors in series with the resistors, respectively, during a conversion cycle of the analog-to-digital converter,
a sampling switch coupling an analog input voltage through a source resistance to a most significant binarily weighted capacitor during a sample cycle of the analog-to-digital converter,
(b) a compensation CDAC including
a second charge summing conductor and a second clamping FET coupled between the clamp voltage and the second charge summing conductor,
a second group of binarily weighted capacitors coupled to the second charge summing conductor,
a second group of bit switch circuits coupled to the capacitors of the second group, respectively,
a group of resistive voltage dividers coupled to the bit switch circuits of the second group, respectively, the bit switches of the second group electrically coupling the capacitors of the second group in series with the resistive voltage dividers, respectively, during the conversion cycle,
a sampling switch coupling a source trim resistor in series with a most significant capacitor of the second group during the sample cycle,
whereby voltages on the first and second charge summing conductors are equal after turning the first and second clamping FETs off despite non-linear gate capacitances and voltage-current properties of the first and second clamping FETs.

16. In a successive approximation analog-to-digital converter, CDAC circuitry comprising in combination:
(a) a main CDAC including
a first charge summing conductor, and a first clamping FET coupled between a clamp voltage and the first charge summing conductor,
a first group of binarily weighted capacitors coupled to the first charge summing conductor,
a first group of bit switch circuits coupled to the capacitors, respectively, the bit switch circuits electrically coupling the capacitors, respectively, to either of two voltage levels during a conversion cycle of the analog-to-digital converter,
a sampling switch coupling an analog input voltage through a source resistance to a most significant binarily weighted capacitor during a sample cycle of the analog-to-digital converter,
(b) a dummy CDAC including
a second charge summing conductor and a second clamping FET coupled between the clamp voltage and the second charge summing conductor,
a second group of binarily weighted capacitors coupled to the second charge summing conductor,
a second group of bit switch circuits coupled to the capacitors, respectively, the bit switch circuits electrically coupling the capacitors, respectively, to fixed reference voltage,
a sampling switch coupling the ground voltage through a matched source resistor to a most significant capacitor of the second group during the sample cycle,
(c) a trim CDAC including
a third group of binarily weighted capacitors and coupling means for coupling the third group of binarily weighted capacitors to one of the first and second charge summing conductors,
a third group of bit switch circuits coupled to the capacitors of the third group, respectively,
a group of resistive voltage dividers coupled to the bit switch circuits of the third group, respectively, the bit switch circuits of the third group electrically coupling the capacitors of the third group in series with the resistive voltage dividers, respectively, during the conversion cycle,
whereby voltages on the first and second charge summing conductors are substantially equal after turning the first and second clamping FETs off despite non-linear gate capacitances and voltage-current properties of the first and second clamping FETs and ratio mismatches between successive capacitors of the first group are compensated for by injection of minute amounts of charge established by the various voltage dividers into or out of the one of the first and second charge summing conductors to which the trim CDAC is coupled.

17. In a successive approximation analog-to-digital converter, the CDAC circuitry of claim 16 wherein the coupling means includes a conductor connecting the third group of binarily weighted capacitors to said one of the first and second charge summing conductors, the main CDAC including a plurality of resistors coupled in series with the capacitors of the first group, respectively, the resistors being matched to the equivalent resistances of the resistive voltage dividers, respectively, channel resistances of pullup and pulldown MOSFETs in the bit switch circuits of the first group being matched to channel resistances of pullup and pulldown MOSFETs, respectively, of corresponding bit switch circuits of the third group.

18. In a successive approximation analog-to-digital converter, the CDAC circuitry of claim 16 wherein the coupling means includes a conductor connecting the third group of binarily weighted capacitors to said one of the first and second charge summing conductors, the CDAC circuitry including a dummy trim DAC including a fourth group of binarily weighted capacitors, and a conductor coupling the fourth group of binarily weighted capacitors to the other of the first and second charge summing conductors, a fourth group of bit switch circuits coupled to the capacitors of the fourth group, respectively, and a group of dummy trim resistors coupled to the bit switch circuits of the fourth group, respectively, the bit switch circuits of the fourth group electrically coupling the capacitors of the fourth group in series with the dummy trim resistors, respectively, during the conversion cycle, the dummy trim resistors being matched to the equivalent resistances of the resistive voltage dividers, respectively.

19. In a successive approximation analog-to-digital converter, the CDAC circuitry of claim 16 wherein the coupling means includes a first stepdown capacitor coupled between said one of said first and second charge summing conductors and the third group of binarily weighted capacitors.

20. In a successive approximation analog-to-digital converter, the CDAC circuitry of claim 19, wherein the CDAC circuitry includes a dummy trim DAC including a fourth group of binarily weighted capacitors, and a second stepdown capacitor coupling the fourth group of binarily weighted capacitors to the other of the first and second charge summing conductors, a fourth group of bit switch circuits coupled to the capacitors of the fourth group, respectively, and a group of dummy trim resistors coupled to the bit switch circuits of the fourth group, respectively, the bit switch circuits of the fourth group electrically coupling the capacitors of the fourth group in series with the dummy trim resistors, respectively, during the conversion cycle, the dummy trim resistors being matched to the equivalent resistances of the resistive voltage dividers, respectively.

* * * * *